May 1, 1973 B. T. MURPHY ET AL 3,730,787

METHOD OF FABRICATING SEMICONDUCTOR INTEGRATED CIRCUITS USING DEPOSITED DOPED OXIDES AS A SOURCE OF DOPANT IMPURITIES

Filed Aug. 26, 1970 2 Sheets-Sheet 1

INVENTORS B. T. MURPHY
P. T. PANOUSIS

BY Arthur J. Torsiglieri

ATTORNEY

United States Patent Office 3,730,787

Patented May 1, 1973

3,730,787

METHOD OF FABRICATING SEMICONDUCTOR INTEGRATED CIRCUITS USING DEPOSITED DOPED OXIDES AS A SOURCE OF DOPANT IMPURITIES

Bernard Thomas Murphy and Peter Theodore Panousis, New Providence, N.J., assignors to Bell Telephone Laboratories, Incorporated, Murray Hill and Berkeley Heights, N.J.

Filed Aug. 26, 1970, Ser. No. 67,016

Int. Cl. H01l *7/44, 19/00;* C23c *11/06*

U.S. Cl. 148—175 7 Claims

ABSTRACT OF THE DISCLOSURE

A method for fabricating semiconductor integrated circuit structures of the type wherein surface zones of a first type semiconductivity extend through an otherwise relatively heavily doped surface layer of the other type semiconductivity. The method employs a doped-oxide mask to provide the layer-forming impurities and also as a mask for enabling selective introduction of zone-forming impurities. An important step in the method employs a silicon nitride cap over the doped oxide during layer-formation to prevent the layer-forming impurities from being introduced into undesired areas under the voids in the mask.

BACKGROUND OF THE INVENTION

This invention relates to fabrication of semiconductor devices; and more particularly to a method for forming localized surface zones of a first type semiconductivity through an otherwise relatively heavily doped layer of the other type semiconductivity.

In the fabrication of a variety of semiconductor devices, among which are the structures disclosed in the copending U.S. applications Ser. No. 703,164, filed Feb. 5, 1968, on behalf of B. T. Murphy, now Pat. No. 3,575,741 issued Apr. 20, 1971, Ser. No. 786,228, filed Dec. 23, 1968, on behalf of V. J. Glinski, now Pat. No. 3,614,555 issued Oct. 19, 1971, and Ser. No. 869,546, filed Oct. 27, 1969, on behalf of V. J. Glinski, now Pat. No. 3,591,840 issued July 7, 1971, it is desired to form a plurality of spaced localized surface zones of one type semiconductivity through an otherwise relatively heavily doped surface layer of the other type semiconductivity which extends across the entire top surface of the wafer. Typically in the art, and as taught in those copending applications, such structures are fabricated by the brute force method of selectively introducing a very heavy concentration of impurities of the one type where the zones are desired and relying on overcompensation to convert portions of the layer to the one type conductivity.

As is known in the art, this approach necessarily implies relationships between surface concentrations and diffusion depths which are often undesirable. Even if the surface concentration and diffusion depth limitations are not troublesome in a particular case, it is also known in the art that an often significant fraction of the layer impurities "push-out" ahead of the zone-forming impurities. Because of this well-known "push-out" effect, complete penetration of the zones through the layer is not readily entirely accomplished.

These problems can be and are avoided by those in the art simply by forming zones of the first type semiconductivity and zones of the second type semiconductivity side by side rather than first forming a nonselective layer across the entire surface and then trying to force a heavier concentration of different impurities through localized portions of the layer. Unfortunately, as practiced heretofore, forming side by side zones of alternate conductivity type typically has been accomplished by employing two or more successive masking operations. As the trend in semiconductor devices has been toward ever smaller geometries, the required precision alignment of successive masks has become increasingly more difficult. Consequently, avoidance of even a single masking operation can result in a significant increase in product yield.

SUMMARY OF THE INVENTION

To obviate these and other problems, our invention includes the use of a doped oxide mask to provide selectively the layer-forming impurities from a solid phase and also as a mask for enabling selective introduction of zone-forming impurities from a solid phase or from a gaseous phase.

An important step in the method employs a nonselectively formed cap over the doped oxide mask during layer formation to prevent layer-forming inpurities from being introduced into undesired areas under the voids in the doped oxide mask.

BRIEF DESCRIPTION OF THE DRAWING

The invention will be more clearly understood from the following detailed description taken in conjunction with the accompanying drawing in which.

It will be appreciated that, for simplicity and clarity of explanation, the figures have not necessarily been drawn to scale.

DETAILED DESCRIPTION

Although the invention as summarized above is of general applicability to the fabrication of semiconductor devices, it will be set forth in detail by reference to two specific embodiments which are presently envisioned to be especially advantageous applications of the method.

Figure 1:
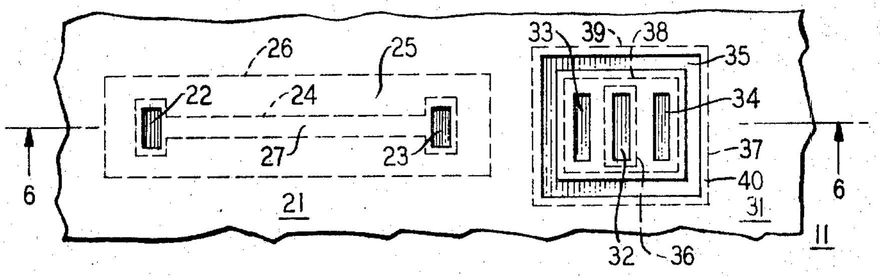
FIG. 1 is a plan view of a portion of a semiconductor integrated circuit wafer showing a resistor and a transistor fabricated in accordance with a first embodiment of our invention.

With reference to FIGS. 1–6, there is shown a plan view and certain illustrative cross sections of a portion of a semiconductor wafer fabricated in accordance with the presently preferred embodiment of our invention. More specifically, FIG. 1 depicts schematically a plan view of a typical resistor 21 and a typical transistor 31 fabricated within a portion 11 of a monocrystalline semiconductor wafer. Solid line patterns depict contact windows formed through an insulating layer by standard photolithographic masking techniques.

As shown in FIG. 1, a resistance zone 27 is defined within broken line pattern 24. A region 25 outside the pattern formed by broken line 24 and inside the rectangular pattern formed by broken line 26 exemplifies an isolation region surrounding resistance zone 27. Also, a transistor 31 is shown comprising a rectangular emitter zone defined within the broken line 36; a rectangular base zone defined within broken line 38; and a collector zone 40 defined on the outside by broken line 39 and on the inside by broken line 38. Solid line pattern 32 represents an emitter contact window; patterns 33 and 34 represent base contact windows; and pattern 35 represents a collector contact window.

Figure 2:
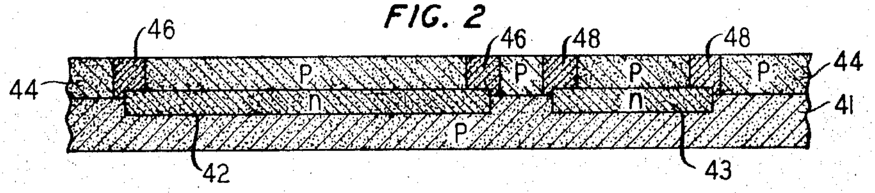
FIGS. 2–6 are cross-sectional views of the same wafer portion substantially as it appears following successive fabrication steps in accordance with the first embodiment.

As evidence by FIGS. 2–6, the subsurface geometry of wafer portion 11 is like that disclosed in the above-referred to Pat. No. 3,575,741, which teaches the fabrication of junction isolated monolithographic integrated circuits with a simplified processing schedule. To this end, as depicted in FIG. 2, initial fabrication steps include forming a pattern of zones 42 and 43 of relatively low resistivity N-type conductivity into the surface of monocrystalline silicon bulk portion 41 which may be a portion of a slice of P-type conductivity produced by boron doping to have a substantially uniform resistivity of about 5 ohm centimeters.

After forming zones 42 and 43, a P-type epitaxial layer 44 is deposited over the surface of bulk portion 41 and over zones 42 and 43 which thereby become buried. A second pattern of zones 46 and 48, termed deep contact zones, is then formed entirely through epitaxial layer 44, e.g., by diffusion or ion implantation. Zones 46 and 48 are ring-like zones, the lateral geometries of which are adjusted to intersect the entire peripheral portions of buried zones 42 and 43. Typically, deep contact zones 46 and 48 are relatively heavily doped, for example, to a surface concentration of about $10^{20}$ atoms of phosphorus per cubic centimeter.

Once the structure of FIG. 2 has been achieved, it is then desired to diffuse P-type impurities non-selectively into the entire surface of the wafer to produce a graded impurity profile to promote transistor efficiencies and to prevent surface recombination of minority carriers, all of which is taught in more detail in the above-referred to Pat. No. 3,575,741.

The present invention can be used to contribute to the ease of fabricating that graded impurity profile and, more importantly, to the ease of subsequently fabricating a localized N-type emitter zone extending from the surface and contiguous with and surrounded by that impurity profile.

Figure 3:
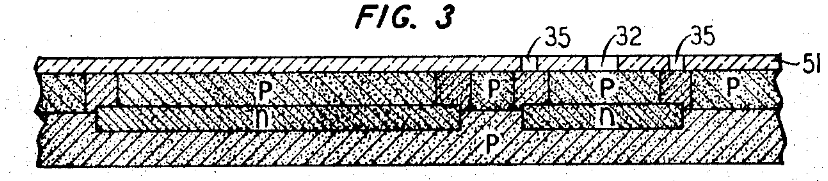

To this end, FIG. 3 shows a doped oxide layer 51 formed over the surface of the wafer. Layer 51 first is formed by nonselectively depositing a continuous coating of about 2000 A. of silicon oxide doped with boron, e.g., by pyrolithic decomposition of silane ($SiH_4$) in an atmosphere containing boron, with the wafer maintained at about 300° C. to 400° C. for about 30 minutes. Then, using standard photolithographic techniques, voids 32 and 35 are formed through layer 51. Void 35 is a ring-like collector contact window; and void 32 is the emitter contact window. Each void will serve the dual purpose of enabling subsequent selective introduction of N-type impurities into the semiconductor and of providing contact windows through which low resistance electrical contact subsequently can be made to the semiconductor surface portions thereunderlying. At this stage, doped layer 51 having the voids formed therethrough constitutes what will be termed a doped-oxide mask 51.

Figure 4:
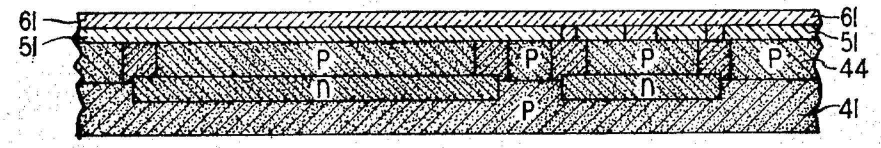

We have discovered that it is especially advantageous to coat the doped-oxide mask with a cap 61, shown in FIG. 4, of a suitable material before diffusing impurities from the mask into layer 44. The main purpose of cap 61 is to prevent the boron impurities from the doped-oxide mask from migrating into the voids during the diffusion heating cycle.

It is known in the art to cap a doped-oxide mask during diffusion. However, prior art workers usually have used a second deposited undoped or doped oxide as the cap. This is disadvantageous because the cap then is not easily removed without incurring a second photolithographic step. In part, our invention lies in the recognition that cap 61 should consist essentially of a material which is readily removable by etching in a solution which does not appreciably attack doped-oxide mask 51 or any of the semiconductor portions. An 1800–2000 A. thick layer of silicon nitride or aluminum oxide, both of which are etched by hot (about 180° C.) phosphoric acid, is a suitable material for cap 61.

After forming cap 61, the structure is heated to a temperature sufficient to drive a desired amount of boron from the doped-oxide mask into the semiconductor to a desired depth. For example, using an oxide doped with about $10^{21}$ boron atoms per cubic centimeter, heating to about 875° C. for about 30 minutes produces about a 0.2 micron diffused portion with a surface concentration of about $10^{19}$ boron atoms per cubic centimeter.

It should be apparent that the concentration of impurities in the doped oxide advantageously is adjusted so that the resulting concentration of impurities diffused into the semiconductor is insufficient to invert the N-type deep contact zones 46 and 48 to P-type.

After diffusing the desired amount of impurities from doped-oxide mask 51 into the semiconductor, silicon nitride cap 61 is removed by immersing in phosphoric acid ($H_3PO_4$) at about 160°–180° C. Inasmuch as the hot phosphoric acid etches the doped oxide and the semiconductor at only a negligible rate relative to the rate at which it etches silicon nitride or aluminum oxide, removal of cap 61 without harming the underlying structure can be a very noncritical, nonphotolithographic procedure.

Figure 5:
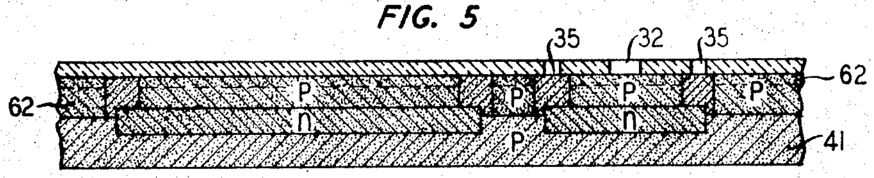

FIG. 5 shows the structure after cap 61 is removed. Note that voids 32 and 35 have been reopened without the use of a selective photolithographic step. Also in FIG. 5, note broken line 62 which represents schematically the depth to which boron impurities from the doped-oxide mask have penetrated during the above-described heating cycle.

Figure 6:
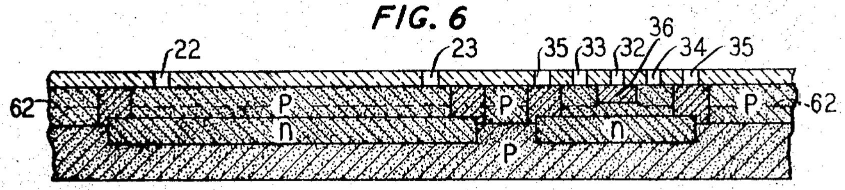

After removal of cap 61 the structure is then subjected to an ambient containing N-type impurities, e.g., phosphorus, primarily to form through void 32 an emitter zone 36, shown in FIG. 6. However, inasmuch as the one photolithographic process is required to form void 32, one can, with but negligible increase in the complexity of the photolithographic mask, form ring-like void 35 as shown so that the N-type emitter-forming impurities also are diffused into deep contact zone 48 to offset the effect of P-type impurities introduced into those zones during the above-described heating cycle. Exercising this option is advantageous where minimum collector series resistance is a goal, as in low power dissipation, nonsaturating logic circuits, and also may be useful where minimum collector-base junction capacitance and maximum collector-base breakdown voltage is desired.

The phosphorous impurities may be introduced from a solid phase by nonselectively depositing a second doped oxide over mask 51 and then heating or from a gaseous phase by procedures well known in the art. By either procedure, doped-oxide mask 51 serves as a diffusion mask so that the phosphorous is introduced selectively into the semiconductor only through voids 32 and 35. Also, of course, doped-oxide mask 51 may be made sufficiently thick to act as a mask through which the phosphorous impurities may be ion implanted selectively in accordance with techniques known in the art. Typically, however, the phosphorous impurities may be introduced from a gaseous phase by diffusing about 90 minutes at 930° C. to a surface concentration of about $10^{21}$ phosphorous atoms per cubic centimeter. After the phosphorous diffusion from the gaseous phase, any remaining phosphorous glass can be removed by briefly etching in dilute HF (about 100 to 1).

A final step, the result of which is shown in FIG. 6, employs a second photolithographic masking step to open contact windows 22 and 23 for resistor 21 and base contact windows 33 and 34 for transistor 31. A variety of arrangements may be adopted for forming electrodes through the contact windows and for accomplishing the interconnection of integrated arrays of functional elements. A particularly advantageous technique includes the use of a beam lead technology such as disclosed in U.S. Pat. No. 3,335,338, issued Aug. 8, 1967, to M. P. Lepselter, and assigned to the assignee hereof.

It will be appreciated that the method in accordance with our invention requires no more photolithographic processes than the method disclosed in the above-referenced application Ser. No. 703,164. Yet the instant method avoids the above-described relationships between surface concentrations and avoids the "push-out" of P-type impurities underneath the N-type emitter zones. In so doing, an improved structure is fabricated with only the additional simply executed step of nonselectively depositing and removing the cap over the doped-oxide mask.

Figure 7:
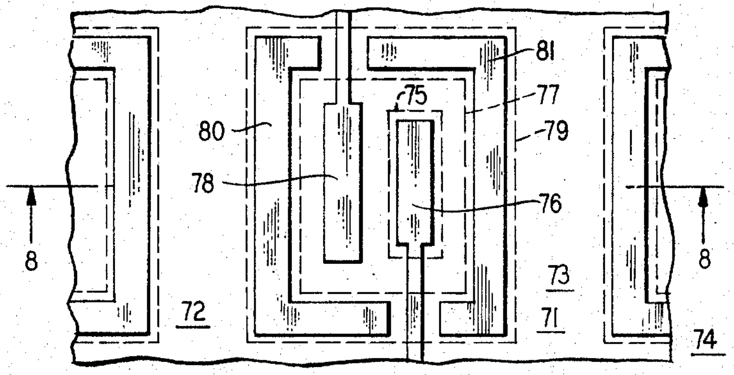
FIG. 7 is a plan view of a transistor and portions of two adjacent transistors fabricated in accordance with a second embodiment of our invention.

Turning now to the second embodiment, there is shown in FIGS. 7–10 a simple self-isolated structure of the type disclosed in above-referenced Pat. Nos. 3,614,555 and 3,591,840 fabricated in accordance with the instant invention. FIG. 7 illustrates schematically a plan view of a typical transistor 71 and portions of two adjacent similar transistors 72 and 73 within a portion 74 of a monocrystalline semiconductor wafer. Solid line patterns depict metallized electrodes which establish electrical contact to the transistors; and broken line patterns depict the positions of PN junctions beneath the surface of a passivating dielectric layer, e.g., an oxide, which overlies the semiconductor regions except where the electrodes are in electrical contact with those semiconductor regions. Accordingly, the broken line patterns indicate the boundaries of the various semiconductive zones which make up the transistors.

More particularly, transistor 71 comprises a rectangular zone defined within broken line rectangle 75 and contacted electrically by metallic electrode 76; a base zone defined within broken line rectangle 77 and contacted electrically by metallic electrode 78; and an annular-like collector zone defined between broken line rectangles 77 and 79 and contacted electrically by metallic electrodes 80 and 81. For simplicity, only a portion of adjacent transistors 72 and 73 are shown.

Figure 8:
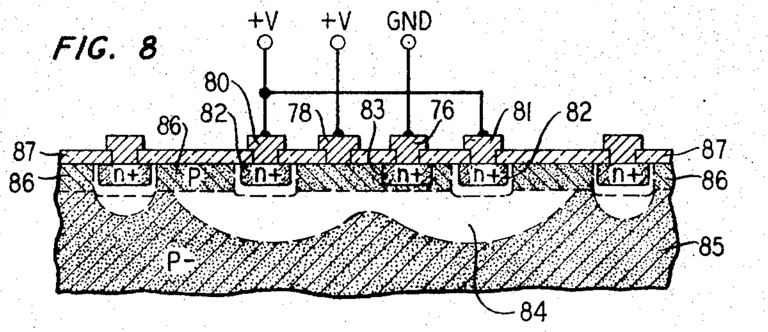
FIG. 8 is a cross-sectional view taken along section line 8—8 in FIG. 7.

FIG. 8 shows a schematic cross-sectional view of the wafer portion of FIG. 7 with a first bias voltage $V_1$ connected to collector electrodes 80 and 81; a second bias voltage $V_2$ connected to base electrode 78; and an electrical ground connected to emitter electrode 76. As described in more detail in the above-reference applications, $V_2$ is typically about 0.7–0.8 volt to provide base drive to turn on the transistor; and $V_1$ is somewhat greater, e.g., 1–5 volts, such that the depletion region 84 extending from annular-like collector zone 82 extends completely underneath all the semiconductive material enclosed laterally by zone 82. It will be appreciated that once this depletion region joins together underneath the enclosed material, that enclosed material is electrically isolated from the P-type material which surrounds zone 82. Additionally, depletion region 84 operates to collect carriers emitted from zone 83.

Of interest to the present invention is the desired structure of a device of the type depicted in FIGS. 7 and 8. First, P-type monocrystalline bulk portion 85 should be lightly doped to enable wide expansion of depletion region 84 with minimum voltage $V_1$ applied. Second, there should be a more heavily doped P-type surface portion 86 to reduce lateral space charge depletion; to keep depletion region 84 away from the interface between semiconductor 86 and passivating dielectric 87 where surface generation of minority carriers would deleteriously affect the performance of devices, and to provide a potential barrier which inhibits the diffusion of minority carriers toward the surface at which they would rapidly recombine. And, third, $N^+$-type zones 82 and 83 should extend entirely through surface portion 86 with no "push-out" of P-type impurities therebeneath because any "push-out" of P-type impurities beneath zones 82 and 83 tends to increase the voltage required to form depletion region 84.

Figure 9:
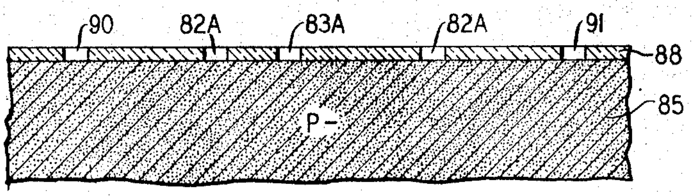
FIGS. 9–11 are cross-sectional views of the wafer portion of FIG. 7 substantially as it appears following significant fabrication steps in accordance with the second embodiment.

In accordance with the present invention such a structure is fabricated, as shown in FIG. 9, by depositing on the surface of a lightly doped P-type monocrystalline wafer 85 a coating 88 of oxide doped with boron to a concentration of about $10^{21}$ per cubic centimeter. Then, using standard photolithographic techniques, voids 82A, 83A, 90, and 91 are formed through coating 88 to enable selective introduction of N-type impurities therethrough.

Figure 10:
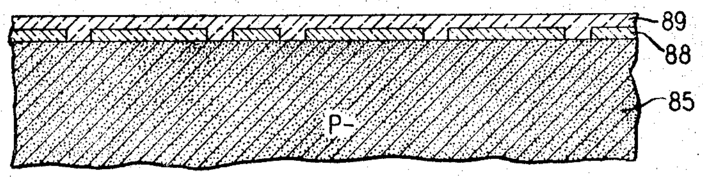

Then a second coating 89, shown in FIG. 10, is deposited nonselectively over coating 88 and into the voids therein. Coating 89 advantageously is doped with phosphorous to a very heavy concentration, e.g., about $10^{23}$ atoms per cubic centimeter. In this second embodiment no separate cap is needed over the doped oxides because the doped oxides 88 and 89 mutually act to prevent impurities from being introduced into undesired portions of the semiconductor surface.

Figure 11:
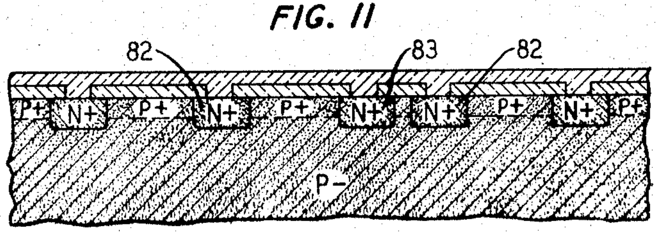

Finally the structure of FIG. 10 is heated to about 930° C. for about 30 minutes to cause boron from coating 88 and phosphorous from coating 89 to diffuse into the semiconductor. The resulting structure is shown in FIG. 11. Note that the $N^+$-type zones extend further than the P-type portions because phosphorous diffuses somewhat faster than boron at a given temperature. Note also that the concentration of boron introduced can be altered independently of the phosphorous concentratons because they are provided by separate solid sources 88 and 89, respectively, and because the phosphorous need not overcompensate any previously formed heavily doped P-type surface portion.

It will be appreciated that in accordance with the instant invention these advantages are accomplished without adding any additional photolithographic steps over those required by the processes disclosed in the above referenced patents.

After the above-described operations are completed, electrodes may be formed as described in the above-referenced applications or in accordance with other compatible techniques known to the art.

Athough my invention has been described in part by making detailed reference to certain specific embodiments, such detail is intended to be and will be understood to be instructive rather than restrictive. It will be appreciated by those in the art that many variations may be made in the structures and methods without departing from the spirit and scope of my invention as disclosed in the teachings contained herein. Of course, for example, the conductivity types may be interchanged as desired in accordance with principles well known in the art.

What is claimed is:

1. A method of fabricating a monolithic semiconductor device comprising the steps of:

depositing upon and contiguous with the entire surface of a semiconductive bulk portion of a first type semiconductivity a substantially continuous and uniform first insulating coating doped with a conductivity determining impurity of the first type;

forming in said first coating a plurality of voids;

depositing upon the first coating and in the voids a second coating, said second coating being of a material which is removable by etching in a solution that does not appreciably attack the semiconductive bulk portion and the doped first coating;

heating the structure to an elevated temperature sufficient to cause impurities to diffuse from the doped first coating into the semiconductive bulk portion;

removing the second coating, without using a selective photolithographic process, by etching in a solution which attacks the second coating but does not appreciably attack the semiconductive material and the first coating; and forming a pattern of localized zones of second type semiconductivity in the bulk portion beneath the voids in the doped first coating.

2. A method as recited in claim 1 wherein the second coating is of a material selected from the group consisting of silicon nitride and aluminum oxide.

3. A method as recited in claim 1 additionally comprising the step of forming a plurality of spaced localized zones of the second type semiconductivity adjacent the surface of the semiconductive bulk portion prior to depositing the first coating.

4. A method as recited in claim 3 wherein the concentration of impurities in the doped first coating is such that the impurities introduced into the semiconductive bulk portion during the heating step are insufficient to convert any portion of the spaced localized zones to the first type semiconductivity.

5. A method of fabricating a monolithic semiconductor device comprising the steps of:

forming, into at least one selected portion of a first major surface of a body of semiconductive material of a first conductivity type, a first pattern including at least one zone of a second conductivity type;

depositing an epitaxial layer of semiconductive material of a first type semiconductivity over said first major surface;

forming into the epitaxial layer a second pattern of deep contact zones of second type semiconductivity, said second pattern disposed so that at least one of the zones of the second pattern intersects the entire perimeter of at least one of the zones of the first pattern;

forming on the entire surface of and contiguous with the epitaxial layer, a layer of silicon oxide doped with a conductivity determining impurity of the first type;

forming a plurality of voids in the doped oxide, each of the voids being disposed over a zone of the first pattern;

depositing upon the doped oxide and in the voids a coating of a material which can be removed by etching in a solution that does not appreciably attack the semiconductor and the doped oxide;

heating the structure to an elevated temperature sufficient to cause the impurities to diffuse from the doped oxide layer into the surface of the epitaxial layer;

wherein the temperature and duration of the heating step and the concentration of impurities in the layer of silicon oxide are such that the impurities introduced into the semiconductive bulk portion during the heating step are insufficient to convert any portion of the spaced localized zones to the first type semi-conductivity;

removing the coating, without using a selective photolithographic process, by etching in a solution which attacks the coating but does not appreciably attack the semiconductive material and the doped oxide; and forming a pattern of zones of second conductivity type in the bulk portion beneath the voids in the doped oxide layer to a depth less than the depth to which the conductivity determining impurities of the first type from the doped oxide layer extend.

6. A method as recited in claim 5 wherein the coating consists essentially of silicon nitride and the solution is phosphoric acid.

7. A method as recited in claim 5 wherein the coating is of a material selected from the group consisting of silicon nitride and aluminum oxide.

References Cited

UNITED STATES PATENTS

| | | | |
|---|---|---|---|
| 3,614,555 | 10/1971 | Glinski | 317—235 R |
| 3,592,707 | 7/1971 | Jaccodine | 156—17 |
| 3,575,741 | 4/1971 | Murphy | 148—175 |
| 3,541,676 | 11/1970 | Brown | 29—578 X |
| 3,596,149 | 7/1971 | Makimoto | 317—235 R |
| 3,388,000 | 6/1968 | Waters et al. | 117—212 |
| 3,391,035 | 7/1968 | Mackintosh | 148—187 |
| 3,479,237 | 11/1969 | Bergh et al. | 156—17 X |
| 3,608,189 | 9/1971 | Gray | 148—187 X |
| 3,551,221 | 12/1970 | Yanagawa | 148—175 |
| 3,442,723 | 5/1969 | Wakamiya | 148—186 |
| 3,287,187 | 11/1966 | Rosenheinrich | 148—187 |
| 3,489,622 | 11/1970 | Barson et al. | 148—188 X |
| 3,560,278 | 2/1971 | Sanera | 148—187 |
| 3,591,840 | 7/1971 | Glinski | 317—235 R |

OTHER REFERENCES

Carlson, G. S., "Multiple Diffusion for Integrated . . . Single Diffusion," IBM Tech. Discl. Bull., vol. 9, No. 10, March 1967, pp. 1456–1458.

Anantha, N. G., "Contact Opening in Shallow Junction Transistors," IBM Tech. Discl. Bull. vol. 11, No. 7, December 1968, p. 857.

Dhaka et al., "Masking Technique," IBM Tech. Discl. Bull. vol. 11, No. 7, December 1968, pp. 864–865.

Electronics International Section of Electronics, Oct. 28, 1968, "Isolationist," pp. 204–205.

L. DEWAYNE RUTLEDGE, Primary Examiner

W. G. SABA, Assistant Examiner

U.S. Cl. X.R.

29—578; 117—212, 213; 148—187, 188; 156—17; 317—235 R